(12) United States Patent
Kimura

(10) Patent No.: US 10,910,546 B2
(45) Date of Patent: Feb. 2, 2021

(54) SURFACE ACOUSTIC WAVE DEVICE AND METHOD OF MANUFACTURING THE SAME

(71) Applicant: Murata Manufacturing Co., Ltd., Nagaokakyo (JP)

(72) Inventor: Tetsuya Kimura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 731 days.

(21) Appl. No.: 15/701,545

(22) Filed: Sep. 12, 2017

(65) Prior Publication Data

US 2017/0373241 A1 Dec. 28, 2017

Related U.S. Application Data

(63) Continuation of application No. PCT/JP2016/057758, filed on Mar. 11, 2016.

(30) Foreign Application Priority Data

May 15, 2015 (JP) ................................. 2015-099763

(51) Int. Cl.
*H01L 41/047* (2006.01)
*H03H 9/02* (2006.01)
(Continued)

(52) U.S. Cl.
CPC .......... *H01L 41/047* (2013.01); *H01L 41/053* (2013.01); *H01L 41/277* (2013.01);
(Continued)

(58) Field of Classification Search
CPC combination set(s) only.
See application file for complete search history.

(56) References Cited

U.S. PATENT DOCUMENTS 5,802,685 A * 9/1998 Kadota .................... H03H 3/08
29/25.35
6,806,796 B2 * 10/2004 Kadota .............. H03H 9/02984
310/313 B
(Continued)

FOREIGN PATENT DOCUMENTS

JP 63-184410 A 7/1988
JP 3106912 B2 11/2000
(Continued)

OTHER PUBLICATIONS

English Translation of WO 2005050836 (Year: 2005).*
Official Communication issued in International Patent Application No. PCT/JP2016/057758, dated May 31, 2016.

*Primary Examiner* — Bryan P Gordon
(74) *Attorney, Agent, or Firm* — Keating & Bennett, LLP

(57) ABSTRACT

An end-surface-reflection surface acoustic wave device, which reflects a surface acoustic wave between first and second end surfaces facing each other, includes a support substrate, an intermediate layer, a piezoelectric layer, and an IDT electrode. The first end surface is located at one end portion in a surface-acoustic-wave propagation direction and extends from a main surface of the piezoelectric layer to at least a portion of the intermediate layer. The second end surface is located at the other end portion in the surface-acoustic-wave propagation direction and extends from the main surface of the piezoelectric layer to at least a portion of the intermediate layer. The support substrate includes support substrate portions that are located outside the first and second end surfaces in the surface-acoustic-wave propagation direction.

20 Claims, 5 Drawing Sheets

(51) Int. Cl.
  *H01L 41/053* (2006.01)
  *H01L 41/277* (2013.01)
  *H03H 9/145* (2006.01)

(52) U.S. Cl.
  CPC .... *H03H 9/02574* (2013.01); *H03H 9/02669* (2013.01); *H03H 9/14541* (2013.01)

(56) References Cited

U.S. PATENT DOCUMENTS

| | | | |
|---|---|---|---|
| 2009/0256444 A1* | 10/2009 | Suzuki | H03H 3/10 |
| | | | 310/313 B |
| 2014/0111062 A1* | 4/2014 | Bauer | H01L 24/11 |
| | | | 310/313 R |
| 2014/0152146 A1* | 6/2014 | Kimura | H01L 41/1873 |
| | | | 310/313 B |
| 2017/0093371 A1* | 3/2017 | Takamine | H03H 9/6436 |

FOREIGN PATENT DOCUMENTS

| | | |
|---|---|---|
| JP | 2001-185975 A | 7/2001 |
| WO | 2005/050836 A1 | 6/2005 |

\* cited by examiner

SURFACE ACOUSTIC WAVE DEVICE AND METHOD OF MANUFACTURING THE SAME

CROSS REFERENCE TO RELATED APPLICATIONS

This application claims the benefit of priority to Japanese Patent Application No. 2015-099763 filed on May 15, 2015 and is a Continuation Application of PCT Application No. PCT/JP2016/057758 filed on Mar. 11, 2016. The entire contents of each application are hereby incorporated herein by reference.

BACKGROUND OF THE INVENTION

1. Field of the Invention

The present invention relates to an end-surface-reflection surface acoustic wave device and a method of manufacturing a surface acoustic wave device.

2. Description of the Related Art

Surface acoustic wave devices have been widely used as resonators or band-pass/rejection filters. Japanese Patent No. 3106912 describes an end-surface-reflection surface acoustic wave device that reflects a surface acoustic wave at two end surfaces that face each other. In Japanese Patent No. 3106912, the end surfaces for reflecting a surface acoustic wave are formed by cutting a piezoelectric plate, on an upper surface of which an IDT electrode is disposed. More specifically, the piezoelectric plate is cut parallel to the electrode fingers in the thickness direction so that portions of two electrode fingers of the IDT electrode that are located at both ends in the surface-acoustic-wave propagation direction are cut off, the portions each having a width of $\lambda/8$ from the outer edges of the electrode fingers.

However, the surface acoustic wave device described in Japanese Patent No. 3106912 is made by cutting the entire piezoelectric plate at the end surfaces. Therefore, after the piezoelectric plate has been cut, it is necessary to place the end-surface-reflection surface acoustic wave device on a mount substrate and to reconnect the end-surface-reflection surface acoustic wave device to another surface acoustic wave device, an LC circuit element, and the like. Accordingly, the inductance of the circuit element may be affected by wires used for reconnection and the like, and the characteristics of the surface acoustic wave device may deteriorate. Moreover, when reconnecting the end-surface-reflection surface acoustic wave device to another circuit element, it is necessary to use connection terminals, such as wire bonding. Since the connection terminals occupy a certain area, the size of the surface acoustic wave device may increase.

SUMMARY OF THE INVENTION

Preferred embodiments of the present invention provide surface acoustic wave devices and methods of manufacturing surface acoustic wave devices in which electrical connection with other elements and circuit components is simplified and the size of an electronic component in which the surface acoustic wave device is mounted is reduced.

A surface acoustic wave device according to a preferred embodiment of the present invention is an end-surface-reflection surface acoustic wave device that includes a first end surface and a second end surface facing the first end surface and that reflects a surface acoustic wave at the first and second end surfaces. The surface acoustic wave device includes a support substrate, an intermediate layer disposed on the support substrate, a piezoelectric layer disposed on the intermediate layer and including a main surface, and an IDT electrode disposed on the main surface of the piezoelectric layer. The first end surface is located at one end portion in a surface-acoustic-wave propagation direction and extends from the main surface of the piezoelectric layer to at least a portion of the intermediate layer. The second end surface is located at the other end portion in the surface-acoustic-wave propagation direction and extends from the main surface of the piezoelectric layer to at least a portion of the intermediate layer. The support substrate includes support substrate portions that are located outside the first and second end surfaces in the surface-acoustic-wave propagation direction. Preferably, the support substrate also functions as a mount substrate. In this case, it is possible to further simplify electrical connection with other elements and circuit components and to further reduce the size of an electronic component in which the surface acoustic device is mounted.

In a surface acoustic wave device according to a preferred embodiment of the present invention, the first and second end surfaces each preferably extend from the main surface of the piezoelectric layer to a portion of the intermediate layer. In this case, it is possible to further reduce or prevent delamination at an interface between the layers.

In a surface acoustic wave device according to another preferred embodiment of the present invention, the support substrate preferably includes a main surface that is in contact with the intermediate layer, and the first and second end surfaces each extend from the main surface of the piezoelectric layer to the main surface of the support substrate.

In a surface acoustic wave device according to another preferred embodiment of the present invention, the support substrate preferably includes a first main surface that is in contact with the intermediate layer and a second main surface that faces the first main surface, and the first and second end surfaces each extend from the main surface of the piezoelectric layer to a position between the first main surface and the second main surface of the support substrate. In this case, it is possible to further reduce or prevent delamination at an interface between the layers.

In a surface acoustic wave device according to another preferred embodiment of the present invention, the intermediate layer preferably has a multi-layer structure in which a plurality of layers are stacked.

In a surface acoustic wave device according to another preferred embodiment of the present invention, the first and second end surfaces each preferably extend from the main surface of the piezoelectric layer to a portion of one of the plurality of layers of the intermediate layer. In this case, it is possible to further reduce or prevent delamination at an interface between the layers.

In a surface acoustic wave device according to another preferred embodiment of the present invention, a layer that is nearest to the support substrate in a stacking direction is preferably made of silicon oxide. In this case, it is possible to further increase adhesion of the intermediate layer to the support substrate.

In a surface acoustic wave device according to another preferred embodiment of the present invention, the first and second end surfaces each extend from the main surface of the piezoelectric layer to a portion of one of the layers of the intermediate layer that is nearest to the support substrate. In this case, it is possible to further reduce or prevent delamination at an interface between the layers.

In a surface acoustic wave device according to another preferred embodiment of the present invention, the support substrate is preferably made of at least one material selected from the group consisting of silicon, sapphire, LiTaO$_3$, LiNbO$_3$, and glass. In this case, it is possible to further increase adhesion of the intermediate layer to the support substrate.

In a surface acoustic wave device according to another preferred embodiment of the present invention, a groove is preferably provided in the piezoelectric layer and the intermediate layer, the groove extending through the piezoelectric layer and at least a portion of the intermediate layer and including a first side surface, and the first side surface of the groove includes the first end surface.

In a surface acoustic wave device according to another preferred embodiment of the present invention, the groove preferably includes a second side surface facing the first side surface, the IDT electrode is a first IDT electrode, and the surface acoustic wave device further includes a second IDT electrode that is adjacent to the first IDT electrode with the groove therebetween in the surface-acoustic-wave propagation direction, and the second side surface of the groove includes an end surface that reflects a surface acoustic wave that is excited by the second IDT electrode. In this case, it is possible to further reduce the size of the surface acoustic wave device.

In a surface acoustic wave device according to another preferred embodiment of the present invention, the IDT electrode is preferably a first IDT electrode, and the surface acoustic wave device further includes a second IDT electrode that is adjacent to the first IDT electrode in the surface-acoustic-wave propagation direction, and a plurality of grooves that are adjacent to each other in the surface-acoustic-wave propagation direction are provided between the first IDT electrode and the second IDT electrode, a side surface of one of the plurality of grooves that is nearest to the first IDT electrode includes the first end surface, and a side surface of one of the grooves nearest to the second IDT electrode includes an end surface that reflects a surface acoustic wave that is excited by the second IDT electrode.

In a surface acoustic wave device according to another preferred embodiment of the present invention, the support substrate, the intermediate layer, and the piezoelectric layer are preferably made of different materials.

A method of manufacturing a surface acoustic wave device according to a preferred embodiment of the present invention is a method of manufacturing a surface acoustic wave device that is structured in accordance with preferred embodiments of the present invention. The method includes a step of forming a stacked body in which the support substrate, the intermediate layer, the piezoelectric layer, and the IDT electrode are stacked in this order; and a step of removing at least a portion of the piezoelectric layer and the intermediate layer by etching so as to form the first and second end surfaces.

A method of manufacturing a surface acoustic wave device according to another preferred embodiment of the present invention preferably further includes a step of removing a portion of the support substrate by dicing so that the first and second end surfaces each extend from the main surface of the piezoelectric layer to a portion of the support substrate. In this case, it is possible to manufacture the surface acoustic wave device at a lower cost and in a shorter time.

With various preferred embodiments of the present invention, surface acoustic wave devices are provided with which electrical connection with other elements and circuit components is simplified. Moreover, surface acoustic wave devices are provided with which the size of an electronic component in which the surface acoustic wave device is mounted is reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the drawings. Note that the preferred embodiments of the present invention described in the present specification are examples, and partial replacement or combination of elements or features may be performed between different preferred embodiments.

First Preferred Embodiment

Figure 1A:
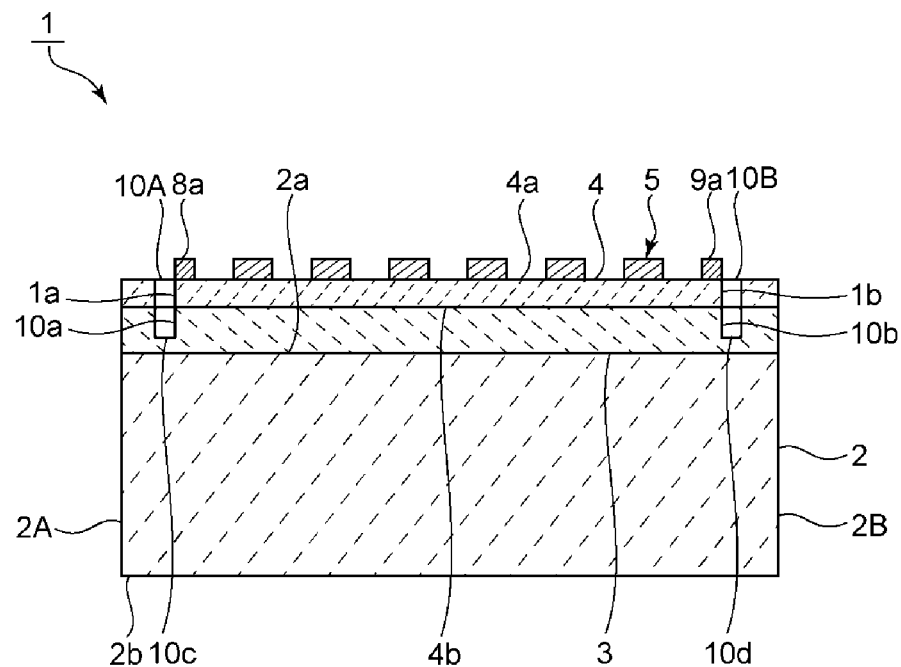
FIG. 1A is a schematic sectional view of a surface acoustic wave device according to a first preferred embodiment of the present invention.
Figure 1B:
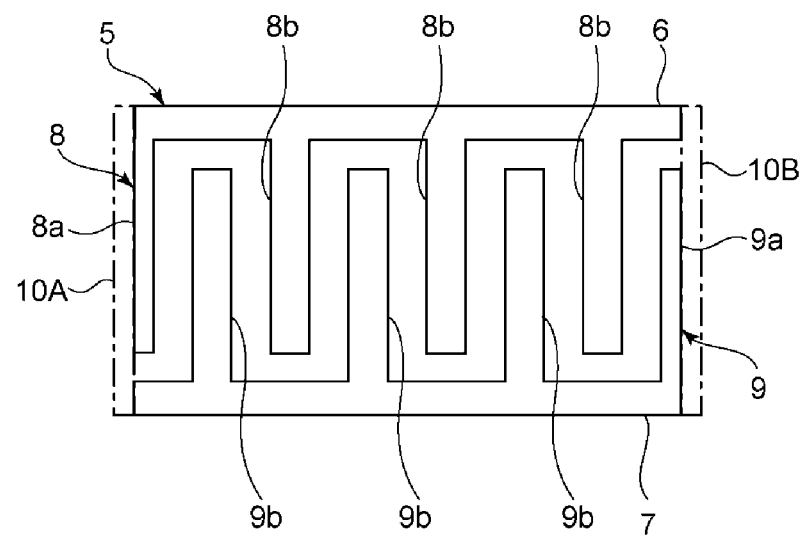
FIG. 1B is a schematic plan view illustrating the structure of an electrode of the surface acoustic wave device.

FIG. 1A is a schematic sectional view of a surface acoustic wave device according to a first preferred embodiment of the present invention, and FIG. 1B is a schematic plan view illustrating the structure of an electrode of the surface acoustic wave device.

A surface acoustic wave device 1 includes first and second end surfaces 1a and 1b. The first and second end surfaces 1a and 1b face each other. The surface acoustic wave device 1 is an end-surface-reflection surface acoustic wave device that reflects a surface acoustic wave at the first and second end surfaces 1a and 1b.

The surface acoustic wave device 1 includes a support substrate 2. The support substrate 2 includes first and second main surfaces 2a and 2b that face each other. The material of the support substrate 2 is not particularly limited.

Examples of the material include a semiconductor such as Si, sapphire, LiTaO$_3$ (hereinafter, referred to as "LT"), LiNbO$_3$ (hereinafter, referred to as "LN"), and glass. These materials may be used individually or in combination.

An intermediate layer 3 is disposed on the first main surface 2a of the support substrate 2. The intermediate layer 3 is preferably made of SiO$_2$, for example. However, the material of the intermediate layer 3 is not particularly limited. Examples of another material include silicon nitride and aluminum nitride. These materials may be used individually or in combination. Preferably, SiO$_2$ is used as the material of the intermediate layer 3 in order to increase adhesion of the intermediate layer 3 to the support substrate 2.

As described below in sixth and seventh preferred embodiments, the intermediate layer 3 may have a multi-layer structure in which a plurality of layers are stacked. In this case, preferably, a layer that is nearest to the support substrate 2 in the stacking direction is made of SiO$_2$.

A piezoelectric layer 4 is disposed on the intermediate layer 3. Preferably, the piezoelectric layer 4 is a thin layer having, for example, a thickness of about 1000 μm or smaller. In this case, it is possible to further excite a surface acoustic wave.

The piezoelectric layer 4 is preferably made of LT. However, the material of the piezoelectric layer 4 may be another piezoelectric single crystal, such as LN, or may be piezoelectric ceramics, for example. The piezoelectric layer 4, the support substrate 2, and the intermediate layer 3 may be made of the same material or may be made of different materials.

The piezoelectric layer 4 includes a third main surface 4a and a fourth main surface 4b that face each other. The fourth main surface 4b of the piezoelectric layer is located on the intermediate layer 3.

A first IDT electrode 5 is disposed on the third main surface 4a of the piezoelectric layer 4. As a surface acoustic wave that is excited by the first IDT electrode 5, the surface acoustic wave device 1 preferably uses a surface acoustic wave that is primarily composed of an SH wave. The wavelength of the surface acoustic wave will be denoted by λ.

As illustrated in FIG. 1B, the first IDT electrode 5 includes first and second busbars 6 and 7 and a plurality of first and second electrode fingers 8 and 9. The plurality of first electrode fingers 8 and the plurality of second electrode fingers are interdigitated with each other. The plurality of first electrode fingers 8 are connected to the first busbar 6, and the plurality of second electrode fingers 9 are connected to the second busbar 7. The term "surface-acoustic-wave propagation direction" refers to a direction that is perpendicular or substantially perpendicular to the direction in which the plurality of first and second electrode fingers 8 and 9 extend.

In the surface acoustic wave device 1, the plurality of first and second electrode fingers 8 and 9 include an electrode finger 8a and an electrode finger 9a that are located at both ends in the surface-acoustic-wave propagation direction. The width of each of the electrode finger 8a and the electrode finger 9a preferably is about λ/8, for example. The width of each of the other electrode fingers 8b and 9b preferably is about λ/4, for example.

The material of the first IDT electrode 5 is not particularly limited. Examples of the material include metals and alloys that are appropriate, such as Cu, Ni, a Ni—Cr alloy, an Al—Cu alloy, Ti, Al, and Pt. These materials may be used individually or in combination. The first IDT electrode 5 may be made from a multi-layer metal film in which a plurality of metal films are stacked.

In a preferred embodiment of the present invention, a SiO$_2$ film, that provides adjustment of temperature characteristics, may preferably be disposed on the third main surface 4a of the piezoelectric layer 4 so as to cover the IDT electrode 5.

As illustrated in FIG. 1A, first and second grooves 10A and 10B are provided in the piezoelectric layer 4 and the intermediate layer 3. The first and second grooves 10A and 10B respectively include first and second side surfaces 10a and 10b and bottom surfaces 10c and 10d. The first and second grooves 10A and 10B are respectively adjacent to the outer sides of the electrode fingers 8a and 9a at both ends in the surface-acoustic-wave propagation direction. The first and second side surfaces 10a and 10b are side surfaces of the first and second grooves 10A and 10B adjacent to the first IDT electrode 5.

The bottom surfaces 10c and 10d of the first and second grooves 10A and 10B are located between the fourth main surface 4b of the piezoelectric layer 4 and the first main surface 2a of the support substrate 2. Accordingly, the bottom surfaces 10c and 10d of the first and second grooves 10A and 10B are not located in the support substrate 2. The bottom surfaces 10c and 10d of the first and second grooves 10A and 10B are also not located at an interface between the layers.

The first side surface 10a of the first groove 10A includes the first end surface 1a. The first end surface 1a extends from the third main surface 4a of the piezoelectric layer to a portion of the intermediate layer 3. The second side surface 10b of the second groove 10B includes a second end surface 1b. The second end surface 1b extends from the third main surface 4a of the piezoelectric layer 4 to a portion of the intermediate layer 3. The first and second grooves 10A and 10B may be omitted, as long as the surface acoustic wave device 1 includes the first and second end surfaces 1a and 1b.

As shown by an alternate long and short dash line in FIG. 1B, the first and second grooves 10A and 10B are preferably provided along a region in which the first IDT electrode 5 is disposed in the direction in which the electrode fingers extend. The first and second grooves 10A and 10B may be provided, in the direction in which the electrode fingers extend, along an excitation region of the IDT electrode 5 in which electrode fingers interdigitate with each other. Alternatively, the first and second grooves 10A and 10B may be provided, in the direction in which the electrode fingers extend, in a region that is larger than a region in which the first IDT electrode 5 is disposed.

As described above, in the surface acoustic wave device 1, the first and second end surfaces 1a and 1b do not extend to the second main surface 2b of the support substrate 2. Therefore, the support substrate 2 includes support substrate portions 2A and 2B, which are located outside the first and second end surfaces 1a and 1b in the surface-acoustic-wave propagation direction. The support substrate portions 2A and 2B are preferably made of the same materials as the support substrate 2.

The support substrate 2 may preferably also define and function as a mount substrate. In this case, it is possible to place other elements and circuit components on the support substrate portions 2A and 2B. Therefore, it is not necessary to reconnect the surface acoustic wave device 1 to other elements and circuit components, and it is possible to simplify the electrical connections. Since other elements and circuit components are able to be placed on the support substrate portions 2A and 2B, it is possible to reduce the size of an electronic component in which the surface acoustic wave device 1 is mounted.

In the surface acoustic wave device 1, the first and second end surfaces 1a and 1b each extend to a portion of the intermediate layer 3. Therefore, compared to a case in which the first and second end surfaces 1a and 1b each extend only to the fourth main surface 4b of the piezoelectric layer 4, it is possible to more reliably reflect a surface acoustic wave at the first and second end surfaces 1a and 1b. The first and second end surfaces 1a and 1b each may preferably be provided in a region extending from the third main surface 4a of the piezoelectric layer 4 to at least a portion of the intermediate layer 3.

In the surface acoustic wave device 1, as described above, the bottom surfaces 10c and 10d of the first and second grooves 10A and 10B are not located at an interface between the layers. Therefore, it is possible to reduce or prevent entry of foreign matter into the interface, and delamination is not likely to occur. Accordingly, in the various preferred embodiments of the present invention, preferably, the bottom surfaces 10c and 10d of the first and second grooves 10A and 10B are not located at an interface between the layers.

A method of manufacturing the surface acoustic wave device 1 is not particularly limited. For example, a non-limiting example of the method may be as follows. First, a stacked body in which the support substrate 2, the intermediate layer 3, the piezoelectric layer 4, and the first IDT electrode 5 are stacked in this order is formed. Next, at least a portion of the piezoelectric layer 4 and the intermediate layer 3 of the stacked body is removed by etching. Thus, the first groove 10A, which includes the first end surface 1a, and the second groove 10B, which includes the second end surface 1b, are formed.

The etching method is not particularly limited. Preferably, ICP-RIE is used as the etching method. By using the ICP-RIE method, it is possible to form the first and second end surfaces 1a and 1b with higher precision.

In the present preferred embodiment, preferably, the angle between the third main surface 4a and the first end surface 1a of the first groove 10A is about 70 degrees or greater and about 90 degrees or smaller, for example. Preferably, the angle between the third main surface 4a and the second end surface 1b of the second groove 10B is about 70 degrees or greater and about 90 degrees or smaller, for example. In this case, it is possible to more reliably reflect a surface acoustic wave at the first and second end surfaces 1a and 1b.

Second and Third Preferred Embodiments

Figure 2:
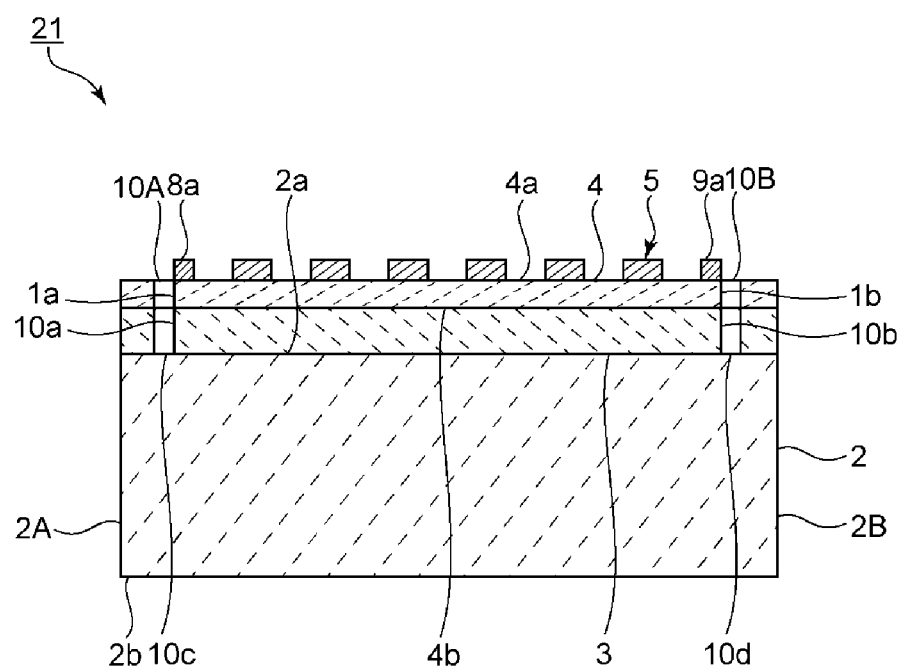
FIG. 2 is a schematic sectional view of a surface acoustic wave device according to a second preferred embodiment of the present invention.

FIG. 2 is a schematic sectional view of a surface acoustic wave device according to a second preferred embodiment of the present invention. As illustrated in FIG. 2, in a surface acoustic wave device 21, the first and second grooves 10A and 10B preferably extend from the third main surface 4a of the piezoelectric layer 4 to the first main surface 2a of the support substrate 2. That is, the first and second end surfaces 1a and 1b each extend from the third main surface 4a of the piezoelectric layer 4 to the first main surface 2a of the support substrate 2. Also in this case, the first and second end surfaces 1a and 1b do not extend to the second main surface 2b of the support substrate 2. Therefore, the support substrate 2 includes the support substrate portions 2A and 2B, which are located outside the first and second end surfaces 1a and 1b in the surface-acoustic-wave propagation direction. In other aspects, the second preferred embodiment is the same or substantially the same as the first preferred embodiment.

Figure 3:
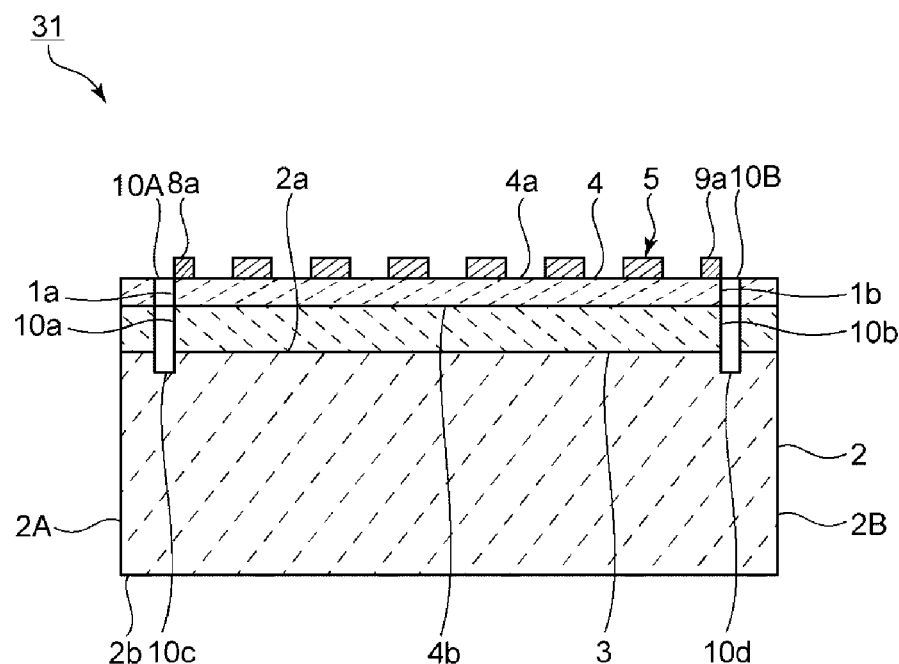
FIG. 3 is a schematic sectional view of a surface acoustic wave device according to a third preferred embodiment of the present invention.

FIG. 3 is a schematic sectional view of a surface acoustic wave device according to a third preferred embodiment of the present invention. As illustrated in FIG. 3, in a surface acoustic wave device 31, the first and second grooves 10A and 10B each preferably extend from the third main surface 4a of the piezoelectric layer 4 to a position between the first main surface 2a and the second main surface 2b of the support substrate 2. That is, the first and second end surfaces 1a and 1b each extend from the third main surface 4a of the piezoelectric layer 4 to a position between the first main surface 2a and the second main surface 2b of the support substrate 2. Also in this case, the first and second end surfaces 1a and 1b do not extend to the second main surface 2b of the support substrate 2. Therefore, the support substrate 2 includes the support substrate portions 2A and 2B, which are located outside the first and second end surfaces 1a and 1b in the surface-acoustic-wave propagation direction. In other aspects, the third preferred embodiment is the same or substantially the same as the first preferred embodiment.

If the piezoelectric layer 4, the intermediate layer 3, and the support substrate 2 are made of different materials, a strain occurs due to a change in temperature because the coefficient of linear expansion differs between the materials. However, when the grooves are each cut to a portion of the support substrate 2 as in the present preferred embodiment, it is possible to reduce the strain. Therefore, if the piezoelectric layer 4, the intermediate layer 3, and the support substrate 2 are made of different materials, preferably, the grooves are each cut to a portion of the support substrate 2 as in the present preferred embodiment.

A non-limiting example of a method of forming the first and second end surfaces 1a and 1b of the surface acoustic wave device 31 is as follows. First, a portion of the piezoelectric layer 4 and the intermediate layer 3 is removed by etching. Next, a portion of the support substrate 2 is removed by dicing. Thus, the first and second grooves 10A and 10B are formed. As a result, it is possible to form the first and second end surfaces 1a and 1b so that the first and second end surfaces 1a and 1b each extends from the third main surface 4a of the piezoelectric layer 4 to a position between the first main surface 2a and the second main surface 2b of the support substrate 2. This method, in which the support substrate 2, which does not contribute to reflection, is cut by dicing, is preferable because this method can be performed at a low cost and in a short time.

The surface acoustic wave devices 21 and 31 each include the support substrate portions 2A and 2B, which are located outside the first and second end surfaces 1a and 1b in the surface-acoustic-wave propagation direction. It is possible to provide other elements and circuit components on the support substrate portions 2A and 2B. Therefore, it is not necessary to reconnect the surface acoustic wave devices 21 and 31 to other elements and circuit components, and it is possible to simplify the electrical connections. Since other elements and circuit components are able to be provided on the support substrate portions 2A and 2B, it is possible to reduce the size of an electronic component in which the surface acoustic wave device 21 or 31 is mounted.

In the surface acoustic wave devices 21 and 31, as described above, the first and second end surfaces 1a and 1b each extend to the first main surface 2a of the support substrate 2 or to a position between the first main surface 2a and the second main surface 2b. Therefore, compared to a case in which the first and second end surfaces 1a and 1b extend only to the fourth main surface 4b of the piezoelectric layer 4, it is possible to more reliably reflect a surface acoustic wave at the first and second end surfaces 1a and 1b.

Fourth and Fifth Preferred Embodiments

Figure 4:
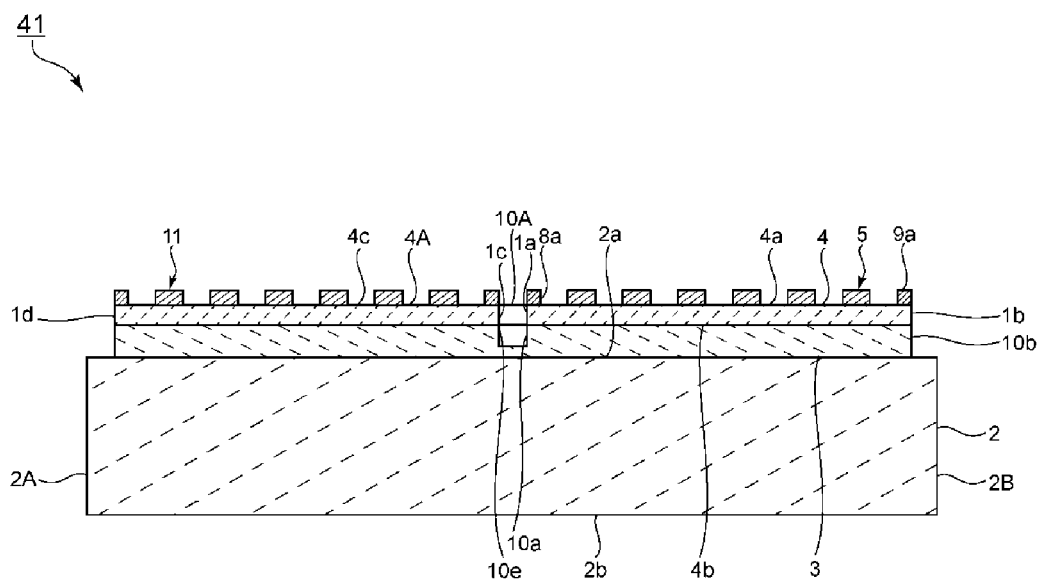
FIG. 4 is a schematic sectional view of a surface acoustic wave device according to a fourth preferred embodiment of the present invention.

FIG. 4 is a schematic sectional view of a surface acoustic wave device according to a fourth preferred embodiment of the present invention. As illustrated in FIG. 4, a surface acoustic wave device 41 further includes a second IDT electrode 11. The second IDT electrode 11 is adjacent to the first IDT electrode 5 with the first groove 10A provided therebetween in the surface-acoustic-wave propagation direction. Accordingly, the second IDT electrode 11 is disposed on the support substrate portion 2A.

The intermediate layer 3 is disposed on the support substrate portion 2A. A piezoelectric layer 4A is disposed on the intermediate layer 3. The piezoelectric layer 4A includes a fifth main surface 4c opposite to a main surface that is in contact with the intermediate layer 3. The piezoelectric layer 4A is preferably made of the same material as the piezoelectric layer 4. The piezoelectric layers 4A and 4 may be made of different materials, although preferably the materials are the same. Examples of the material of the piezoelectric layer 4A include piezoelectric single crystals, such as LT and LN, and piezoelectric ceramics. These materials may be used individually or in combination.

The second IDT electrode 11 is disposed on the fifth main surface 4c of the piezoelectric layer 4A. The second IDT electrode 11 is preferably made of the same material as the first IDT electrode 5. The second IDT electrode 11 and the first IDT electrode 5 may be made of different materials, although preferably the materials are the same. The material of the second IDT electrode 11 is not particularly limited. Examples of the material include metals and alloys that are appropriate, such as Cu, Ni, a Ni—Cr alloy, an Al—Cu alloy, Ti, Al, and Pt. These materials may be used individually or in combination. The second IDT electrode 11 may be made from a multi-layer metal film in which a plurality of metal films are stacked.

The surface acoustic wave device 41 includes third and fourth end surfaces 1c and 1d that reflect a surface acoustic wave that is excited by the second IDT electrode 11. The third end surface 1c is included in a third side surface 10e of the first groove 10A. The third side surface 10e is a side surface that faces the first side surface 10a. Accordingly, the third end surface 1c faces the first end surface 1a in the surface-acoustic-wave propagation direction.

The fourth end surface 1d is located at an end portion that is opposite the third end surface 1c in the surface-acoustic-wave propagation direction. The fourth end surface 1d is located so as to face the third end surface 1c at a position that is opposite the first end surface 1a in the surface-acoustic-wave propagation direction. The third and fourth end surfaces 1c and 1d each extend from the fifth main surface 4c to a portion of the intermediate layer 3. The surface acoustic wave device 41 includes only the first groove 10A and does not include another groove. In other aspects, the fourth preferred embodiment is the same or substantially the same as the first preferred embodiment. The surface acoustic wave device 41 may also include a groove so as to define the second and fourth end surfaces 1b and 1d.

Figure 5:
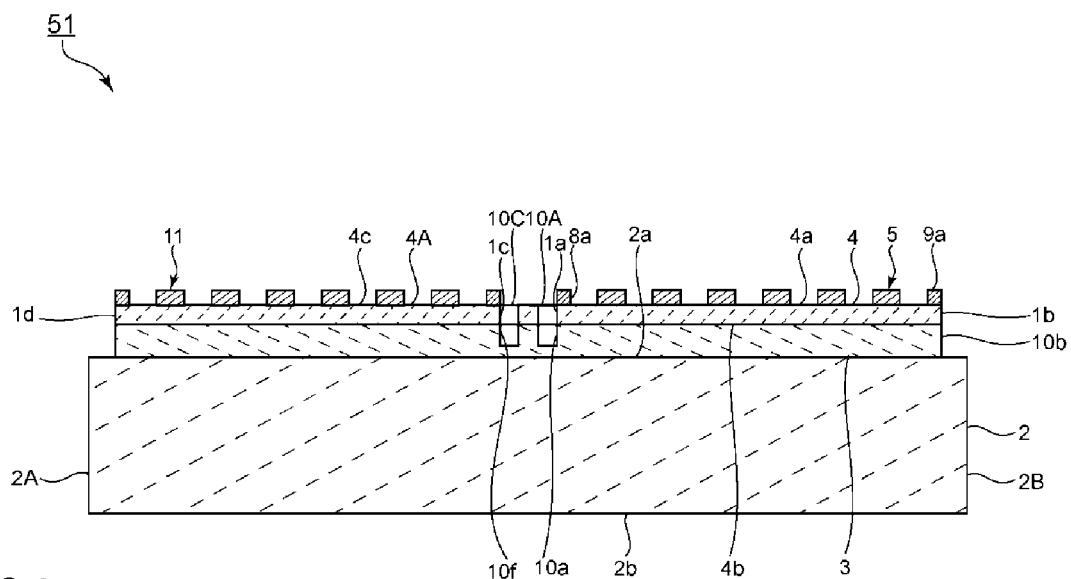
FIG. 5 is a schematic sectional view of a surface acoustic wave device according to a fifth preferred embodiment of the present invention.

FIG. 5 is a schematic sectional view of a surface acoustic wave device according to a fifth preferred embodiment of the present invention. As illustrated in FIG. 5, in a surface acoustic wave device 51, a third groove 10C is additionally provided between the first IDT electrode 5 and the second IDT electrode 11. More specifically, the third groove 10C is located between the first groove 10A and the second IDT electrode 11. The third groove 10C include a fourth side surface 10f. The fourth side surface 10f is a side surface of the third groove 10C adjacent to the second IDT electrode 11. In the surface acoustic wave device 51, the fourth side surface 10f of the third groove 10C includes the third end surface 1c. In other aspects, the fifth preferred embodiment is the same or substantially the same as fourth preferred embodiment. As shown in the fifth preferred embodiment, a plurality of grooves may be provided between the first IDT electrode 5 and the second IDT electrode 11.

In the fourth and fifth preferred embodiments, the first and second IDT electrodes 5 and 11 are disposed adjacent to each other in the surface-acoustic-wave propagation direction. In general, when a plurality of IDT electrodes are arranged in the surface-acoustic-wave propagation direction, interference occurs and the characteristics deteriorate. However, in the fourth and fifth preferred embodiments, at least one groove is provided between the first and second IDT electrodes 5 and 11, which are adjacent to each other, and the groove separates the two IDT electrodes from each other. Therefore, in the surface acoustic wave devices 41 and 51, deterioration of the characteristics is not likely to occur. Three or more IDT electrodes may be disposed adjacent to each other with a groove therebetween in the surface-acoustic-wave propagation direction.

Thus, with a surface acoustic wave device according to a preferred embodiment of the present invention, because a plurality of IDT electrodes are able to be arranged in the surface-acoustic-wave propagation direction, it is possible to reduce the size of an electronic component in which the surface acoustic wave device is mounted. Moreover, since the plurality of IDT electrodes are able to be disposed on one support substrate, it is possible to simplify the electrical connections.

In the surface acoustic wave devices 41 and 51, the first to fourth end surfaces 1a to 1d each extend to a portion of the intermediate layer 3. Therefore, compared to a case in which the first to fourth end surfaces 1a to 1d each extend only to the interface between the piezoelectric layers 4 and 4A and the intermediate layer 3, it is possible to more reliably reflect a surface acoustic wave at the end surfaces.

In the surface acoustic wave device 41, the first groove 10A may preferably extend from the third and fifth main surfaces 4a and 4c of the piezoelectric layers 4 and 4A to the first main surface 2a of the support substrate 2. That is, the first and third end surfaces 1a and 1c may respectively extend from the third and fifth main surfaces 4a and 4c of the piezoelectric layers 4 and 4A to the first main surface 2a of the support substrate 2.

In the surface acoustic wave device 41, the first groove 10A may preferably extend from the third and fifth main surfaces 4a and 4c of the piezoelectric layers 4 and 4A to a position between the first main surface 2a and the second main surface 2b of the support substrate 2. That is, the first and third end surfaces 1a and 1c may respectively extend from the third and fifth main surfaces 4a and 4c of the piezoelectric layers 4 and 4A to positions between the first main surface 2a and the second main surface 2b of the support substrate 2. If the piezoelectric layer 4, the intermediate layer 3, and the support substrate 2 are made of different materials, a strain occurs due to a change in temperature because the coefficient of linear expansion differs between the materials. However, when the grooves are each cut to a portion of the support substrate 2, it is possible to reduce the strain.

In the surface acoustic wave device 51, the first and third grooves 10A and 10C may preferably extend from the third and fifth main surfaces 4a and 4c of the piezoelectric layers 4 and 4A to the first main surface 2a of the support substrate 2. That is, the first and third end surfaces 1a and 1c may respectively extend from the third and fifth main surfaces 4a and 4c of the piezoelectric layers 4 and 4A to the first main surface 2a of the support substrate 2.

In the surface acoustic wave device 51, the first and third grooves 10A and 10C may preferably respectively extend from the third and fifth main surfaces 4a and 4c of the piezoelectric layers 4 and 4A to positions between the first main surface 2a and the second main surface 2b of the support substrate 2. That is, the first and third end surfaces 1a and 1c may respectively extend from the third and fifth main surfaces 4a and 4c of the piezoelectric layers 4 and 4A to positions between the first main surface 2a and the second main surface 2b of the support substrate 2. If the piezoelectric layer 4, the intermediate layer 3, and the support substrate 2 are made of different materials, a strain occurs due to a change in temperature because the coefficient of linear expansion differs between the materials. However, when the grooves are each cut in a portion of the support substrate 2, it is possible to reduce the strain.

Sixth and Seventh Preferred Embodiments

Figure 6:
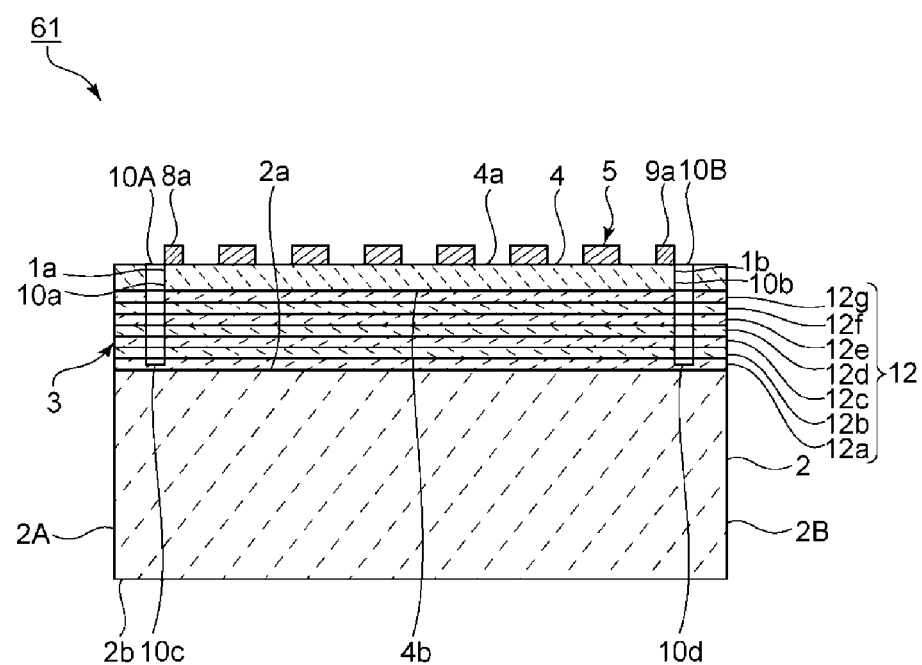
FIG. 6 is a schematic sectional view of a surface acoustic wave device according to a sixth preferred embodiment of the present invention.

FIG. 6 is a schematic sectional view of a surface acoustic wave device according to a sixth preferred embodiment of the present invention. As illustrated in FIG. 6, a surface acoustic wave device 61 includes an acoustic reflective layer 12, which corresponds to the intermediate layer 3. The acoustic reflective layer 12 includes a plurality of acoustic impedance layers. In the present preferred embodiment, the acoustic reflective layer 12 preferably includes low-acoustic-impedance layers 12a, 12c, 12e, and 12g; and high-acoustic-impedance layers 12b, 12d, and 12f.

The acoustic impedances of the high-acoustic-impedance layers 12b, 12d, and 12f are higher than those of the low-acoustic-impedance layers 12a, 12c, 12e, and 12g.

In the surface acoustic wave device 61, the low-acoustic-impedance layer 12a is stacked on the first main surface 2a of the support substrate 2. On the low-acoustic-impedance layer 12a, the high-acoustic-impedance layers 12b, 12d, and 12f and the low-acoustic-impedance layers 12c, 12e, and 12g are alternately stacked in the stacking direction.

Therefore, a surface acoustic wave that has propagated from the piezoelectric layer 4 is reflected at interfaces of the high-acoustic-impedance layers 12b, 12d, and 12f, which are upper surfaces of the low-acoustic-impedance layers 12a, 12c, and 12e. Thus, it is possible to more efficiently confine the energy of the surface acoustic wave in the piezoelectric layer 4.

The low-acoustic-impedance layers 12a, 12c, 12e, and 12g are preferably made of $SiO_2$, for example. However, the low-acoustic-impedance layers 12a, 12c, 12e, and 12g may be made of Al or other suitable materials. These materials may be used individually or in combination.

In the surface acoustic wave device 61, a layer that is nearest to the support substrate 2 in the stacking direction is preferably the low-acoustic-impedance layer 12a, which is made of $SiO_2$. Therefore, in the surface acoustic wave device 61, adhesion of the intermediate layer 3 to the support substrate 2 is increased. In order to increase adhesion of the intermediate layer 3 to the support substrate 2, preferably, a layer that is nearest to the support substrate 2 in the stacking direction is made of $SiO_2$.

The high-acoustic-impedance layers 12b, 12d, and 12f are preferably made of SiN, for example. However, the high-acoustic-impedance layers 12b, 12d, and 12f may be made of W, LT, $Al_2O_3$, LN, AlN, ZnO, or other suitable materials, for example. These materials may be used individually or in combination.

In the surface acoustic wave device 61, the first and second end surfaces 1a and 1b each extend from the third main surface 4a of the piezoelectric layer 4 to a portion of the low-acoustic-impedance layer 12a. When the intermediate layer has a multi-layer structure as in the present preferred embodiment, preferably, the first and second end surfaces 1a and 1b each extend to a portion of a layer that is nearest to the support substrate 2 in the stacking direction.

In the present preferred embodiment, the number of low-acoustic-impedance layers and the number of high-acoustic-impedance layers are not particularly limited. The low-acoustic-impedance layers and the high-acoustic-impedance layers need not be alternately stacked in the stacking direction. In order to further increase the efficiency in confining a surface acoustic wave in the piezoelectric layer 4, preferably, at least one of the low-acoustic-impedance layers is disposed nearer than at least one of the high-acoustic-impedance layers to the piezoelectric layer 4. In other aspects, the fifth and sixth preferred embodiments are the same or substantially the same as the first preferred embodiment.

Figure 7:
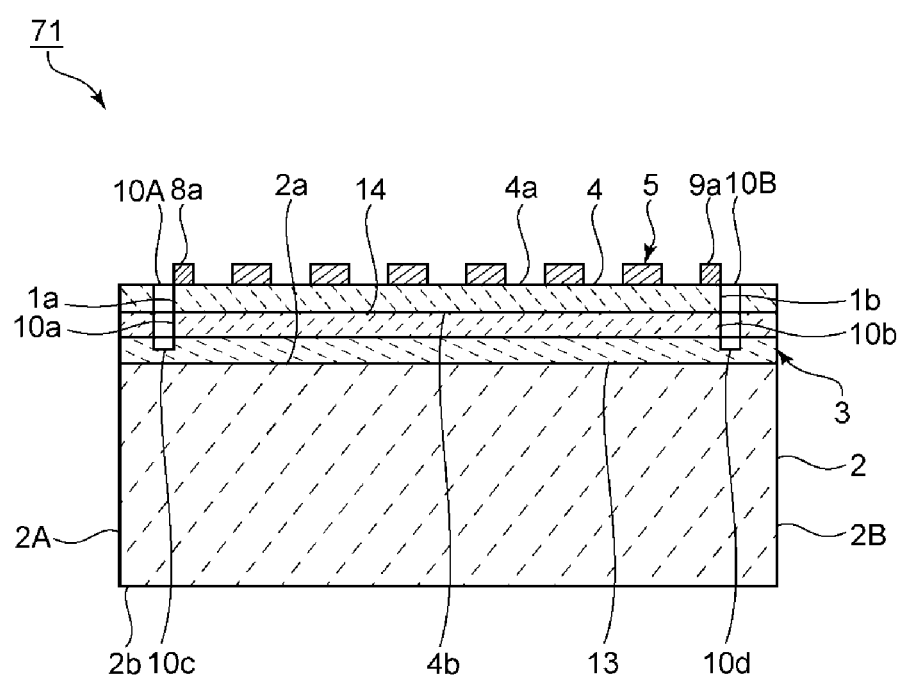
FIG. 7 is a schematic sectional view of a surface acoustic wave device according to a seventh preferred embodiment of the present invention.

FIG. 7 is a schematic sectional view of a surface acoustic wave device according to a seventh preferred embodiment of the present invention. As illustrated in FIG. 7, in a surface acoustic wave device 71, the intermediate layer 3 includes a high-acoustic-velocity film 13 and a low-acoustic-velocity film 14. More specifically, the high-acoustic-velocity film 13, in which an acoustic wave propagates at a relatively high velocity, is stacked on the support substrate 2. The low-acoustic-velocity film 14, in which an acoustic wave propagates at a relatively low velocity, is stacked on the high-acoustic-velocity film 13. Accordingly, the piezoelectric layer 4 is stacked on the low-acoustic-velocity film 14.

The high-acoustic-velocity film 13 confines a surface acoustic wave in a region in which the piezoelectric layer 4 and the low-acoustic-velocity film 14 are stacked and to prevent leakage of the surface acoustic wave to a structure below the high-acoustic-velocity film 13. In the present preferred embodiment, the high-acoustic-velocity film 13 is preferably made of aluminum nitride, for example. However, as long as the high-acoustic-velocity film 13 can confine the surface acoustic wave, the high-acoustic-velocity film 13 may be made of any high-acoustic-velocity material. Examples of the material include aluminum nitride, aluminum oxide, silicon carbide, silicon nitride, silicon oxynitride, a DLC film, diamond, a medium containing any of the these materials as a main component, and a medium containing a mixture of any of these materials. In order to confine a surface acoustic wave in a region in which the piezoelectric layer 4 and the low-acoustic-velocity film 14 are stacked, preferably, the thickness of the high-acoustic-velocity film 13 is as large as possible. Preferably, the thickness is about $0.5\lambda$ or greater and more preferably about $1.5\lambda$ or greater, for example, where $\lambda$ is the wavelength of the surface acoustic wave.

The low-acoustic-velocity film 14 is preferably made of silicon oxide, for example. However, as the material of the low-acoustic-velocity film 14, it is possible to use any appropriate material in which a bulk wave propagates at a lower acoustic velocity than in the piezoelectric layer 4. Examples of such a material include silicon oxide; glass; silicon oxynitride; tantalum oxide; a chemical compound in which fluorine, carbon, or boron is added to silicon oxide; and a medium containing may of these materials as a main component.

In the present specification, the high-acoustic-velocity film 13 is a film in which a bulk wave propagates at an acoustic velocity that is higher than the acoustic velocity of a surface wave or a boundary wave that propagates in the piezoelectric layer 4. The low-acoustic-velocity film 14 is a film in which a bulk wave propagates at a lower acoustic velocity than in the piezoelectric layer 4.

In the surface acoustic wave device 71, the first and second end surfaces 1a and 1b each extend from the third main surface 4a of the piezoelectric layer 4 to a portion of the high-acoustic-velocity film 13. In other aspects, the seventh preferred embodiment is the same or substantially the same as the first preferred embodiment.

The surface acoustic wave devices 61 and 71 each preferably include the support substrate portions 2A and 2B, which are located outside the first and second end surfaces 1a and 1b in the surface-acoustic-wave propagation direction. It is possible to provide other elements and circuit components on the support substrate portions 2A and 2B. Therefore, it is not necessary to reconnect the surface acoustic wave devices 61 and 71 to other elements and circuit components, and it is possible to simplify the electrical connections. Since other elements and circuit components are able to be placed on the support substrate portions 2A and 2B, it is possible to reduce the size of an electronic component in which the surface acoustic wave device 61 or 71 is mounted.

In the surface acoustic wave devices 61 and 71, as described above, the first and second end surfaces 1a and 1b extend to a layer that is nearest to the support substrate 2 in the stacking direction. Therefore, compared to a case in which the first and second end surfaces 1a and 1b extend only to the fourth main surface 4b of the piezoelectric layer 4, it is possible to more reliably reflect a surface acoustic wave at the first and second end surfaces 1a and 1b.

In the surface acoustic wave devices 61 and 71, the first and second grooves 10A and 10B may preferably extend from the third main surface 4a of the piezoelectric layer 4 to the first main surface 2a of the support substrate 2. That is, the first and second end surfaces 1a and 1b may each extend from the third main surface 4a of the piezoelectric layer 4 to the first main surface 2a of the support substrate 2.

In the surface acoustic wave devices 61 and 71, the first and second grooves 10A and 10B may each preferably extend from the third main surface 4a of the piezoelectric layer 4 to a position between the first main surface 2a and the second main surface 2b of the support substrate 2. That is, the first and second end surfaces 1a and 1b may each extend from the third main surface 4a of the piezoelectric layer 4 to a position between the first main surface 2a and the second main surface 2b of the support substrate 2. If the piezoelectric layer 4, the intermediate layer 3, and the support substrate 2 are made of different materials, a strain occurs due to a change in temperature because the coefficient of linear expansion differs between the materials. However, when the grooves are each cut in a portion of the support substrate 2, it is possible to reduce the strain.

A surface acoustic wave device according to any of the various preferred embodiments of the present invention is applicable to a variety of electronic apparatuses and telecommunication apparatuses. Examples of the electronic apparatus include a sensor. Example of the telecommunication apparatus include a duplexer including a surface acoustic wave device according to a preferred embodiment of the present invention, a telecommunication module including a surface acoustic wave device according to a preferred embodiment of the present invention and a PA (Power Amplifier) and/or a LNA (LowNoise Amplifier) and/or a SW (Switch), a mobile communication device including the telecommunication module, and a health care telecommunication device including the telecommunication module. Examples of the mobile communication device include a cellular phone, a smart phone, and a car navigation system. Examples of the health care telecommunication device include a bathroom scale and a body fat monitor. The health care telecommunication apparatuses and the mobile communication devices include an antenna, an RF module, an LSI, a display, an input unit, a power supply, and the like.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An end-surface-reflection surface acoustic wave device comprising:
    a first end surface and a second end surface facing the first end surface and that reflects a surface acoustic wave at the first and second end surfaces;
    a support substrate;
    an intermediate layer disposed on the support substrate;
    a piezoelectric layer disposed on the intermediate layer and including a main surface; and
    an IDT electrode disposed on the main surface of the piezoelectric layer; wherein
    the first end surface is located at one end portion in a surface-acoustic-wave propagation direction and extends from the main surface of the piezoelectric layer into at least a portion of the intermediate layer;
    the second end surface is located at the other end portion in the surface-acoustic-wave propagation direction and extends from the main surface of the piezoelectric layer into at least a portion of the intermediate layer; and
    the support substrate includes support substrate portions that are located outside the first and second end surfaces in the surface-acoustic-wave propagation direction.

2. The surface acoustic wave device according to claim 1, wherein the support substrate defines a mount substrate.

3. The surface acoustic wave device according to claim 1, wherein the first and second end surfaces each extend from the main surface of the piezoelectric layer into only a portion of the intermediate layer.

4. The surface acoustic wave device according to claim 1, wherein
    the support substrate includes a main surface that is in contact with the intermediate layer; and
    the first and second end surfaces each extend from the main surface of the piezoelectric layer to the main surface of the support substrate.

5. The surface acoustic wave device according to claim 1, wherein
    the support substrate includes a first main surface that is in contact with the intermediate layer and a second main surface that faces the first main surface; and
    the first and second end surfaces each extend from the main surface of the piezoelectric layer to a position between the first main surface and the second main surface of the support substrate.

6. The surface acoustic wave device according to claim 1, wherein the intermediate layer has a multi-layer structure including a plurality of layers that are stacked.

7. The surface acoustic wave device according to claim 6, wherein the first and second end surfaces each extend from the main surface of the piezoelectric layer to a portion of one of the plurality of layers of the intermediate layer.

8. The surface acoustic wave device according to claim 6, wherein a layer of the plurality of layers of the intermediate layer that is nearest to the support substrate in a stacking direction is made of silicon oxide.

9. The surface acoustic wave device according to claim 8, wherein the first and second end surfaces each extend from the main surface of the piezoelectric layer to a portion of the layer of the plurality of layers of the intermediate layer that is nearest to the support substrate.

10. The surface acoustic wave device according to claim 8, wherein the support substrate is made of at least one material selected from the group consisting of silicon, sapphire, $LiTaO_3$, $LiNbO_3$, and glass.

11. The surface acoustic wave device according to claim 1, wherein a groove is provided in the piezoelectric layer and the intermediate layer, the groove extending through the piezoelectric layer and at least a portion of the intermediate layer and including a first side surface, and the first side surface of the groove includes the first end surface.

12. The surface acoustic wave device according to claim 11, wherein
the groove includes a second side surface facing the first side surface;
the IDT electrode is a first IDT electrode, and the surface acoustic wave device further includes a second IDT electrode that is adjacent to the first IDT electrode with the groove provided therebetween in the surface-acoustic-wave propagation direction; and
the second side surface of the groove includes an end surface that reflects a surface acoustic wave that is excited by the second IDT electrode.

13. The surface acoustic wave device according to claim 1, wherein
the IDT electrode is a first IDT electrode, and the surface acoustic wave device further includes a second IDT electrode that is adjacent to the first IDT electrode in the surface-acoustic-wave propagation direction; and
a plurality of grooves that are adjacent to each other in the surface-acoustic-wave propagation direction are provided between the first IDT electrode and the second IDT electrode, a side surface of one of the plurality of grooves that is nearest to the first IDT electrode includes the first end surface, and a side surface of one of the grooves nearest to the second IDT electrode includes an end surface that reflects a surface acoustic wave that is excited by the second IDT electrode.

14. The surface acoustic wave device according to claim 1, wherein the support substrate, the intermediate layer, and the piezoelectric layer are made of different materials.

15. The surface acoustic wave device according to claim 1, wherein the intermediate layer is made of $SiO_2$.

16. The surface acoustic wave device according to claim 6, wherein the plurality of layers of the intermediate layer include low-acoustic-impedance layers and high-acoustic-impedance layers.

17. The surface acoustic wave device according to claim 16, wherein the low-acoustic-impedance layers and high-acoustic-impedance layers are alternately stacked.

18. The surface acoustic wave device according to claim 16, wherein at least one of low-acoustic-impedance layers is closer to the piezoelectric layer than the high-acoustic-impedance layers.

19. A method of manufacturing the surface acoustic wave device according to claim 1, the method comprising:
a step of forming a stacked body in which the support substrate, the intermediate layer, the piezoelectric layer, and the IDT electrode are stacked in this order; and
a step of removing at least a portion of the piezoelectric layer and the intermediate layer by etching so as to form the first and second end surfaces.

20. The method of manufacturing the surface acoustic wave device according to claim 19, further comprising a step of removing a portion of the support substrate by dicing so that the first and second end surfaces each extend from the main surface of the piezoelectric layer to a portion of the support substrate.

\* \* \* \* \*